United States Patent [19]

Herzberg

[11] Patent Number: 5,996,104
[45] Date of Patent: Nov. 30, 1999

[54] SYSTEM FOR CODING SYSTEM

[76] Inventor: Hanan Herzberg, 329 Devon Pl., Morganville, N.J. 07751

[21] Appl. No.: 08/924,146

[22] Filed: Sep. 5, 1997

Related U.S. Application Data

[60] Provisional application No. 60/026,053, Sep. 13, 1996.

[51] Int. Cl.$^6$ .................................................. H03M 13/22
[52] U.S. Cl. ........................... 714/755; 714/701; 714/787
[58] Field of Search ..................................... 714/755, 761, 714/762, 787, 788, 701

[56] References Cited

U.S. PATENT DOCUMENTS

| | | | |
|---|---|---|---|
| 4,907,233 | 3/1990 | Deutsch et al. | 371/37.4 |
| 5,023,889 | 6/1991 | Divsalar et al. | 375/27 |
| 5,113,401 | 5/1992 | Chevillat et al. | 371/43 |
| 5,168,509 | 12/1992 | Nakamura et al. | 375/39 |
| 5,392,299 | 2/1995 | Rhines et al. | 371/37.5 |
| 5,406,570 | 4/1995 | Berrou et al. | 371/43 |
| 5,446,747 | 8/1995 | Berrou | 371/45 |
| 5,563,897 | 10/1996 | Pyndiah et al. | 371/37.4 |
| 5,581,481 | 12/1996 | Weerackody et al. | 364/514 |
| 5,671,156 | 9/1997 | Weerackody et al. | 364/514 |

OTHER PUBLICATIONS

Cheung et al., "PC Based Data Communications System Simulation", Ninth International Phoenix Conference on Computers and Communications, Mar. 21–23, 1990, pp. 209–216.

Jung et al., "Dependence of the Error Performance of Turbo–Codes on the Interleaver Structure in Short Frame Transmission Systems", Electronics Letters, Feb. 17, 1994, vol. 30, No. 4, pp. 287–288.

Robertson, "Improving Decoder and Code Structure of Parallel Concatenated Recursive Systematic (Turbo) Codes", Third International Conference on Universal Personal Communications, Sep. 27 to Oct. 1, 1994, pp. 183–187.

Barbulescu et al., "Interleaver Design for Turbo Codes", Electronics Letters, Dec. 8, 1994, vol. 30, No. 25, pp. 2107–2108.

Barbulescu et al., "Terminating the Trellis of Turbo–Codes in the Same State", Electronics Letters, Jan. 5, 1995, vol. 31, No. 1, pp. 22–23.

Papke et al., "Combined Multilevel Turbo–Code with MR–Modulation", International Conference on Communications, Jun. 18–22, 1995, pp. 668–672.

(List continued on next page.)

*Primary Examiner*—Stephen M. Baker
*Attorney, Agent, or Firm*—Thomas, Kayden, Horstemeyer & Risley

[57] ABSTRACT

A method and apparatus for coding an information signal are provided. In accordance with one aspect of the invention, the method includes the step of encoding all or a portion of the information signal with a first encoder to generate a first set of redundant bits (preferably $r_1$ bits). The method further includes the step of passing a portion of (and possibly all) the information signal through a structured interleaver to generate an interleaved signal. The method then encodes all or a portion of the interleaved signal with a second encoder to generate a second set of redundant bits (preferably $r_2$ bits). Finally, the method includes the step of concatenating the information signal, the first set of redundant bits, and the second set of redundant bits to form an encoded output signal. A significant aspect of the present invention is the use of a structured interleaver in the encoder. It has been found that the structured interleaver provides a low bit error rate, and a much shorter length (and thus delay) than random interleavers. The foregoing concept apply equally to multi-level coding, wherein a parallel concatenated code defined by a structured interleaver may be utilized as a constituent code in a multi-level encoder.

17 Claims, 12 Drawing Sheets

OTHER PUBLICATIONS

Barbulescu et al., "Interleaver Design for Three Dimensional Turbo Codes", International Conference on Information Theory, Sep. 17–22, 1995, p. 37.

Blackert et al., "Turbo Code Termination and Interleaver Conditions", Electronics Letters, Nov. 23, 1995, vol. 31, No. 24, pp. 2082–2084.

Bendetto et al., "Parallel Concatenated Trellis Coded Modulation", International Conference on Communications, Jun. 23–27, 1996, pp. 974–978.

Herzberg, "Multilevel Turbo Coding with a Short Latency", ISIT, Jun. 29 to Jul. 4, 1997, p. 112.

0–7803–0950–2/93/$3.00©1993 IEEE, Near Shannon Limit Error—Correcting Coding and Decoding: Turbo–Codes(1), Berrou et al., Feb. 1993, pp. 1064–1070.

IEEE Transactions on Information Theory, vol. IT–23, No. 3, 1997, A New Multilevel Coding Method Using Error–Correcting Codes, Imai et al., pp. 371–377.

IEEE Transactions on Information Theory, vol. IT–28, No. 1, Jan. 1982, Channel Coding with Multilevel/Phase Signals, Gottfried Ungerboeck, pp. 55–66.

IEEE Transactions on Information Theory, vol. 35, No. 1, Jan. 1989, Multilevel Codes Based on Partitioning Pottie et al.., pp. 87–98.

IEEE Transactions on Information Theory, vol. 42, No. 2, Mar. 1996, Iterative Decoding of Binary Block and Convolutional Codes, Hagenauer et al., pp. 429–445.

IEEE Transactions on Information Theory, vol. 42, No. 2, Mar. 1996, Unveiling Turbo Codes: Some Results on Parallel Concatenated Coding Schemes, Benedetto et al., pp. 409–428.

Jet Propulsion Laboratory, California Institute of Technology, Pasadena, CA 91109, Divsalar et al., 1995 (published after Feb. 15, 1995),. pp. 1–6.

SYSTEM FOR CODING SYSTEM

CROSS-REFERENCE TO RELATED APPLICATIONS

This application claims the benefit of U.S. Provisional Application Ser. No. 60/026,053, filed Sep. 13, 1996, and entitled METHOD FOR ENCODING CONCATENATED CODES.

BACKGROUND OF THE INVENTION

1. Field of the Invention

The present invention generally relates to systems for signal coding, and more particularly to a signal coding system utilizing a unique parallel concatenated coding method for achieving improved bit error rates.

2. Discussion of the Related Art

Signal coding, or channel coding, has long been know as a way to protect the integrity of data transmitted through a channel. Through the implementation of coding, unsystematic redundancy can be removed from message signals so that channels can be used with maximum efficiency. In addition, through the use of coding, systematic redundancy can be introduced into the transmitted signal so that errors caused by noisy channels can be corrected. Stated another way, the ability to detect and/or correct errors resulting from a noisy transmission channel can only be provided by the additional transmission of redundant bits, and thus by lowering the effective information rate for a given transmission bandwidth.

A fundamental axiom which has motivated the development of coding methods, known as Shannon's coding theorem, provides that if a source generates information at a rate that is less than the capacity of a transmission channel, there exists some encoding procedure that will permit the source output to be transmitted through the channel with an arbitrarily small probability of error. Multilevel coding of signals is one coding method known for achieving increased transmission speeds. However, multilevel signals are more likely to be corrupted by channel noise. Therefore, error-correcting schemes are generally implemented in multilevel coding systems.

As is further known, interleaving is a method used in connection with channel coding to further improve the transmission efficiency, which operates to time-disperse bits or symbols before encoding and transmission. Often, several "important" source bits are produced in immediate succession. Since a burst error, such as a channel fade, could corrupt all of these adjacent bits, it is desirable to time-disperse adjacent information bits. Moreover, by rearranging the order of such bits in connection with the redundant encoding, further noise immunity is achieved.

As a further improvement, a parallel concatenated coding method, also known as turbo coding, has been developed. In its simplest form, a parallel concatenated coding scheme includes two simple constituent systematic encoders linked by an interleaver. The input bits to the first encoder are scrambled by the interleaver before entering the second encoder. The codeword of the parallel concatenated code generally consists of the input bits to the first encoder followed by the parity check bits of both encoders, although this construction can be generalized to any number of constituent codes.

It has been demonstrated that parallel concatenated schemes employing convolutional codes as constituent codes, in connection with an iterative decoding algorithm, yield coding gains very close to the their theoretical limits (i.e., Shannon limit). However, in the parallel concatenated codes known by the Applicant, the enhanced performance achieved due to the tremendous reduction in error coefficients, has been obtained by utilizing a very long random interleaver. As with any long code word, these parallel concatenated codes generally suffer at least one important shortcoming; namely, the delay due to the long random interleaver and to the iterative decoding. As a result, this type of coding realizes intolerable delays for many applications. A further shortcoming relates the complexity of maximum-likelihood (ML) decoding algorithms, whereby the decoding complexity increases with increasing length of the interleaver.

Various methods and apparatus for coding signals are known in the art, and are described in various publications including, "Near Shannon Limit Error Correcting Coding and Decoding: Turbo-Codes," C. Berrou, A. Glavienux and P. Thitimajshima, *Proc. of the ICC '93*, Geneva, Switzerland, pp. 1064–1070, May 1993, "Unveiling Turbo Codes: Some Results on Parallel Concatenated Coding Schemes," S. Benedetto and G. Montorsi, *IEEE Trans. Information Theory*, vol. IT-42, pp. 409–428, March 1996, "Iterative Decoding of 2 0 Binary Block and Convolutional Codes," J. Hagenauer, *IEEE Trans. Information Theory*, vol IT42, pp. 429–445, March 1996, "Turbo Codes for PCS Applications," D. Divsalar and F. Pollara, *Proc. of the ICC '95*, Seattle, Wash., June 1995, "Multilevel Codes Based on Partitioning," G. J. Pottie and D. P. Taylor, *IEEE Trans. Information Theory*, vol. IT-35, pp. 87–98, January 1989, "Multilevel Coding Method Using Error-Correcting Codes," H. Imai and S. Hirakawa, *IEEE Trans. Information Theory*, vol. IT-23, pp. 371–377, May 1977, and "Channel Coding with Multilevel/Phase Signals," G. Ungerboeck, *IEEE Trans. Information Theory*, vol. IT-28, pp. 55–67, January 1982, which are all hereby incorporated by reference.

SUMMARY OF THE INVENTION

Accordingly, it is a primary aim of the present invention to provide a coding system achieving improved efficiencies. Certain objects, advantages and novel features of the invention will be set forth in part in the description that follows and in part will become apparent to those skilled in the art upon examination of the following or may be learned with the practice of the invention. The objects and advantages of the invention may be realized and obtained by means of the instrumentalities and combinations particularly pointed out in the appended claims.

To achieve the advantages and novel features, the present invention is generally directed to a method for coding an information signal. In accordance with one aspect of the invention, the method includes the step of encoding the information signal with a first encoder to generate a first set of redundant bits (preferably $r_1$ bits). The method further includes the step of passing the information signal through a structured interleaver to generate an interleaved signal. The method then encodes the interleaved signal with a second encoder to generate a second set of redundant bits (preferably $r_2$ bits). Finally, the method includes the step of concatenating the information signal, the first set of redundant bits, and the second set of redundant bits to form an encoded output signal.

The present invention provides a substantial improvement over the parallel concatenated codes known in the prior art, which utilize long random interleavers, and by providing relatively short, structured interleavers. As a result, an increased minimum Hamming distance is obtained. For low BERs (which is desired BERs in many applications), the performance of the parallel concatenated codes with a structured interleaver is better than that obtained with a random interleaver. Another important advantage of the structured interleaver is the short required length. A short interleaver introduces only a short decoding delay, where in the case of parallel concatenated code, short interleavers may have additional advantage. In this regard, short interleavers may reduced the decoding complexity and the required memory, since a soft out soft in decoding algorithm should be implemented for the constituent codes.

Another significant advantage made possible by the present invention is the ability to submit less than all information bits to a given encoder. While it is generally desirable to encode all information bits, such encoding need not be performed at a single encoder. It will be appreciated that the same does not hold true for the parallel concatenated coding apparatus of the prior art. Specifically, when a random interleaver is used, at least one encoder must encode all of the information bits. Otherwise, there is a statistical probability that one or more of the information bits will not be encoded. In contrast, by using a structured in accordance with the present invention, the interleaver can be designed to ensure that all information bits get encoded, even though only a portion of the information bits may be submitted to each encoder.

In accordance with a further aspect of the invention, parallel concatenated codes are used as component codes in multilevel codes. As the first component code $C_1$ a parallel concatenated convolutional code (PCCC), with a reverse block interleaver, is used. It is found that a coding gain of more than 5.5 dB may be achieved when the parallel concatenated code $C_1$ includes two 8-state, (i.e., M=3) convolutional codes, each of rate one-half. The rate of the resulting parallel concatenated code is a one-third binary code. Additional improvement in the performance is obtained by using 16-state constituent codes and a punctured code. In this case, the rate of the parallel concatenated code can be increased to one-half (i.e., an increase of $\frac{1}{6}$ can be obtained in the number of information bits per symbol). Namely, an additional 1 dB of coding gain can be obtained by using punctured codes. Depdening upon the performance needed, a suboptimal iterative decoder may be employed. Although a suboptimal iterative decoder will generally degrade the performance, it substantially reduces the computational complexity. Base on simulation results, it is found that the performance degradation is usually very small, especially for small BERs.

DESCRIPTION OF THE DRAWINGS

The accompanying drawings incorporated in and forming a part of the specification, illustrate several aspects of the present invention, and together with the description serve to explain the principles of the invention. In the drawings.

DETAILED DESCRIPTION OF THE PREFERRED EMBODIMENT

Figure 1:
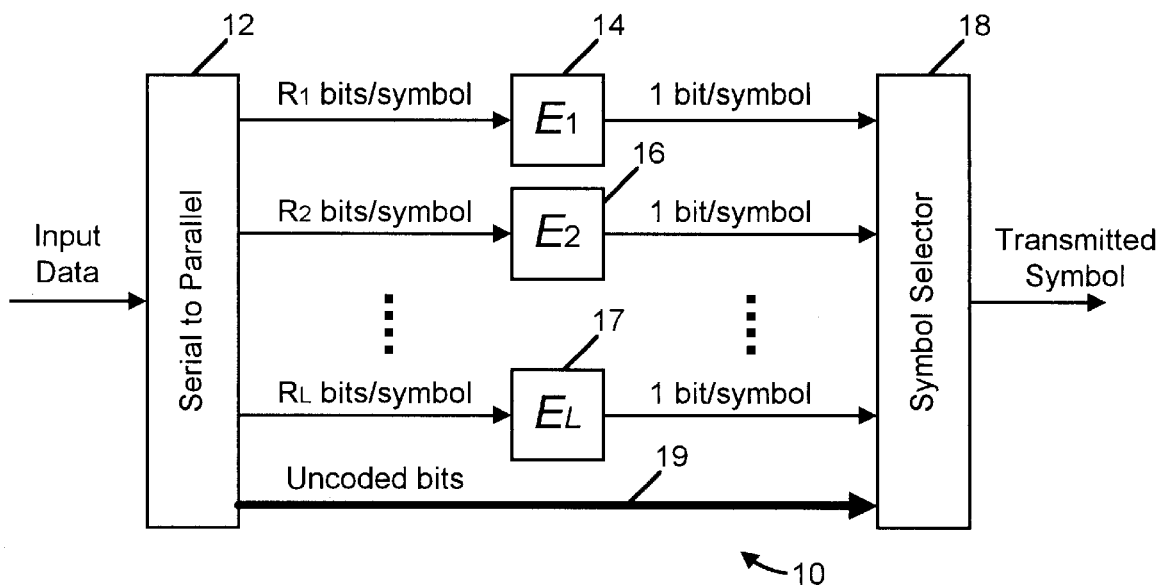
FIG. 1 is a block diagram illustrating a multilevel encoder, as is known in the prior art.

Having summarized the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

Background on Multilevel Encoding and Multistage Decoding

Before discussing the preferred embodiment of the present invention, a background on multilevel encoding and multistage decoding will first be provided. In this regard, reference is made to FIG. 1, which is a block diagram illustrating the structure of a simple multilevel encoder 10. The illustrated encoder is an L level encoder having a serial to parallel converter 12 at the front end. As is known, the serial to parallel converter 12 includes an input and a plurality of outputs. Most of the outputs are associated with, and directed to an encoder 14, 16, 17. Each of the encoders 14, 16, 17 will receive one or more bits for encoding, and output the encoded bits to a symbol selector 18. As illustrated, uncoded bits may be communicated directly from the serial to parallel converter 12 to the symbol selector 18 across one or more lines 19.

Multilevel coding has been recognized as an efficient way of combining error correction coding with modulation. Multilevel coding, is generally a combination of several error correction codes applied to subsets of some signal constellation. As is known, a typical code of this kind is, based on a set $S_0$ and an L level partition chain $S_0/S_1 \ldots /S_L$. In the multilevel encoder 10 of FIG. 1, the sequence of bits associated with the partition $S_{i-1}/S_i$ is a codeword of the binary code $C_i(n_i, k_i)$, and $E_i$ is the corresponding encoder. The multilevel code may be made up of convolutional component codes, block codes, or a combination thereof An important parameter of a coded modulation scheme is the computational complexity of the decoder. Usually a kind of suboptimal decoder (e.g., multistage decoder) is used for multilevel codes. An example of a simple multistage decoder 20 is shown in FIG. 2. The decoder 20 employs a separate decoder (e.g., 22, 24, 26) for each of the codes $C_1$, $C_2, \ldots, C_L$. The decoding process starts with the decoding of $C_1$, based on the received signal. The decoding of $C_i$, for $i=2, 3, \ldots, L$ is based on the received signal and the estimated codewords of $C_1, C_2, \ldots, C_{i-1}$, without using any information related to the codes $C_{i+i}, \ldots, C_L$.

The multistage decoder 20 is referred to as a suboptimal decoder because, during the decoding of a component code, there is no information regarding the component codes at the higher partition levels. For example, decoder 22 does not have information regarding the component codes output from decoder 24. The lack of this information can lead to an increase in the error coefficient of the code (and other elements in the spectrum of distances as well). Furthermore, errors might propagate through the decoders of the components codes, causing an increase in the average bit error rate (BER). However, the reduction in coding gain, due to suboptimal decoding, is small, whereas the reduction in complexity is substantial.

Parallel Concatenated Codes

Figure 3:
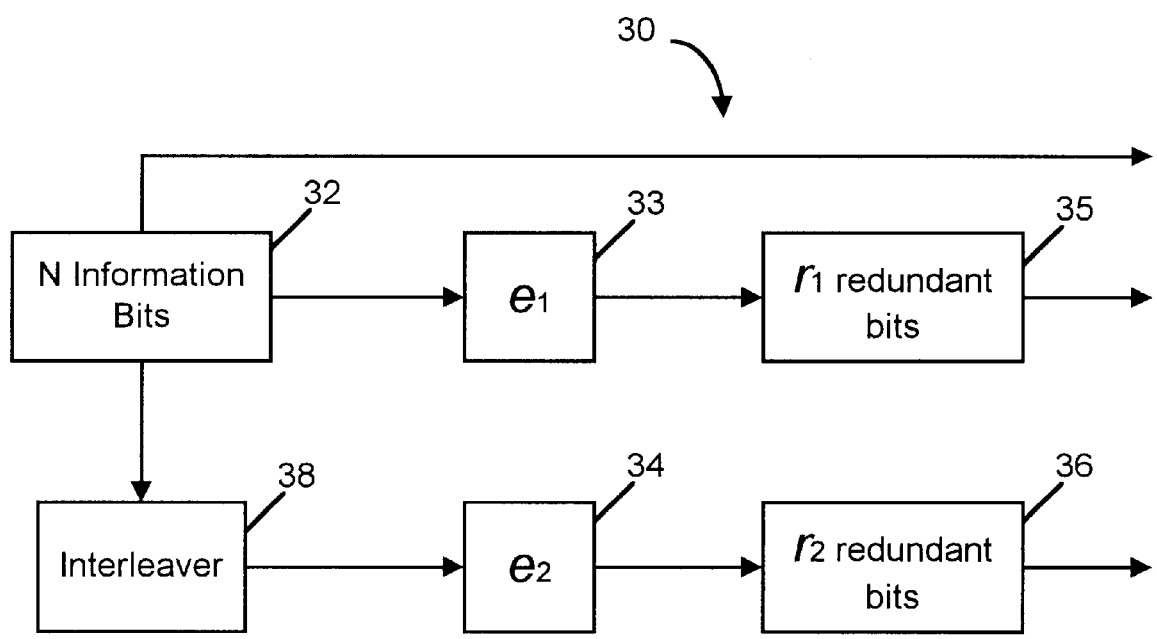
FIG. 3 is a block diagram of a simple two level encoder for generating a parallel concatenated code, as is known in the prior art.

Reference is now made to FIG. 3, which is a block diagram of a simple parallel concatenated encoder 30. In this encoder, a block 32 of N bits is encoded twice, once by the encoder $e_1$ 33 (note that the notation $E_1$ is reserved for the multilevel encoder) in order to produce a codeword of $c_1$, and again, after interleaving, by the encoder $e_2$ 34, in order to produce a codeword of $c_2$. The encoders 33 and 34 create two blocks 35 and 36 of r1 and r2 redundant bits, respectively. It should be appreciated that more than two encoders 33, 34 can be used. However, additional encoders will generally require an additional interleaver 38, for each additional encoder. Thus, N encoders will generally require N−1 interleavers. Furthermore, there is generally no restriction to use different encoders, and frequently $c_1$ and $c_2$, are the same binary codes. These codes may be block or convolutional codes. When a memoryless channel (e.g., AWGN channel) is used, the order of the transmitted bits is not important—e.g., each information bit can be followed by a redundant bit.

The encoder 30 shown in FIG. 3 creates a (N+$r_1$+$r_2$, N) block code, where N+$r_1$+$r_2$ is the length of this code. Since the information bits are transmitted only once, and are part of the codewords, $e_1$ and $e_2$ must be systematic encoders. In case of block codes it is straightforward to construct a systematic encoder, many widely used block codes the generator matrix of the systematic code are well known. Note that a codeword of a parallel concatenated code consists of several codewords of $c_1$ and $c_2$.

Figure 4A:
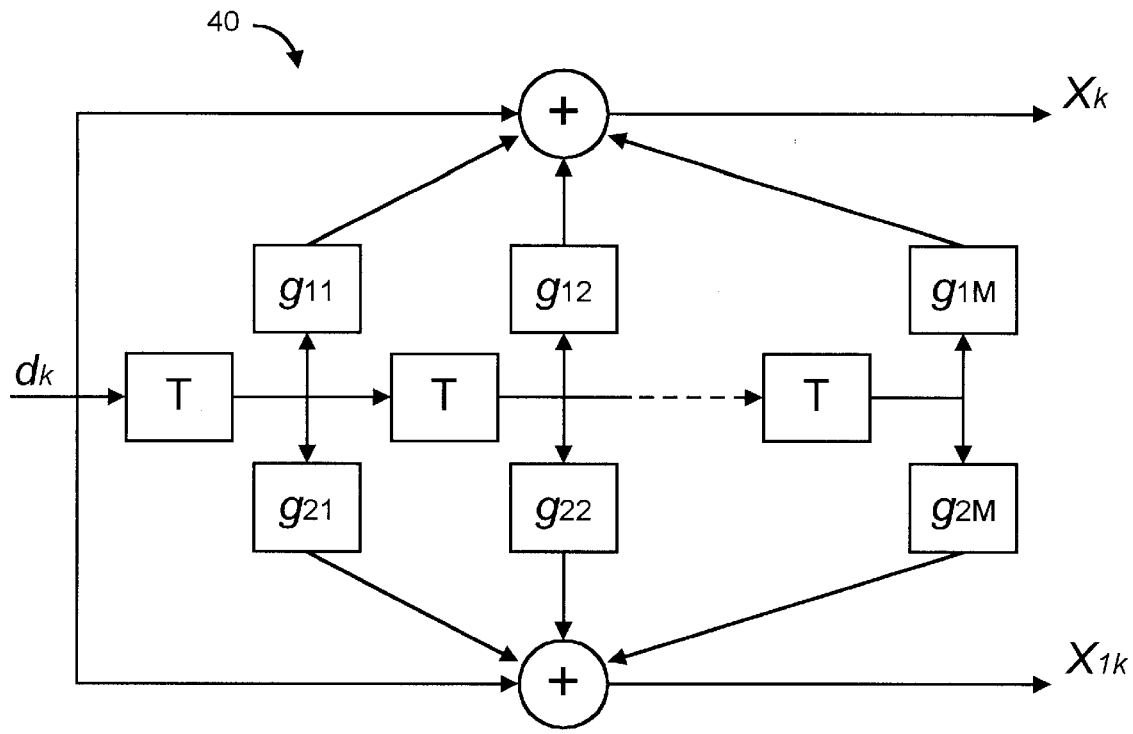
FIG. 4A is a block diagram of a non-systematic convolutional encoder, as is known in the prior art.
Figure 4B:
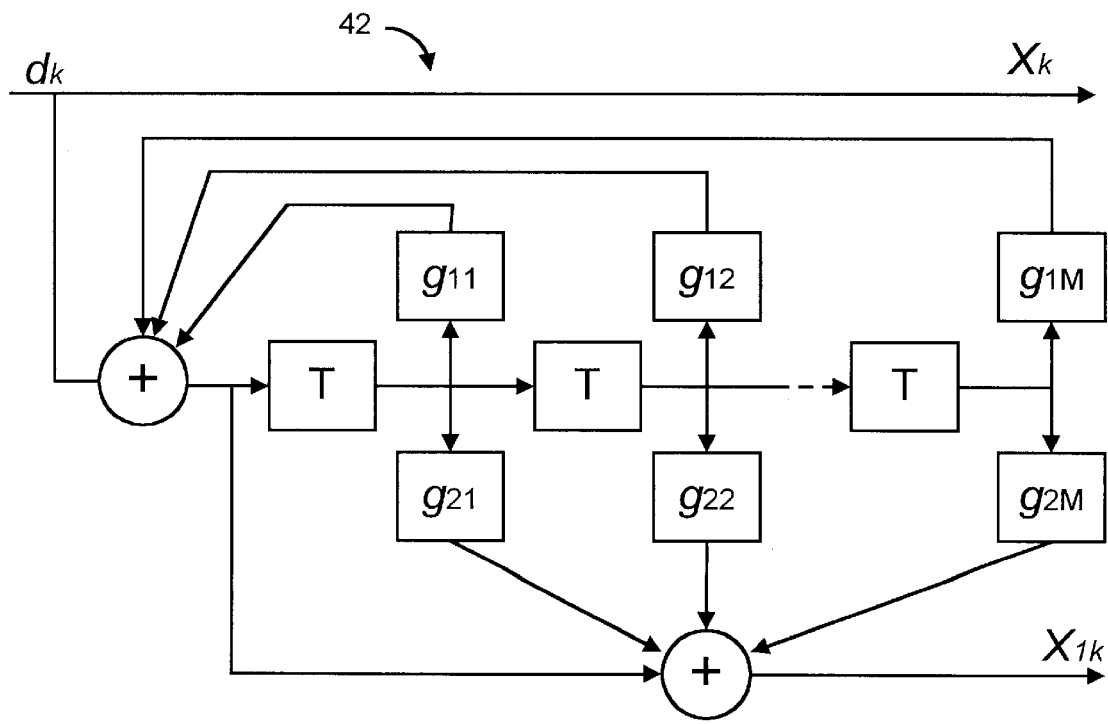
FIG. 4B is a block diagram of a systematic convolutional encoder, as is known in the prior art.

Reference is now made to FIGS. 4A and 4B, which illustrate a non-systematic convolutional encoder 40 and a systematic convolutional encoder 42, respectively. Convolutional codes are conventionally implemented in a non-systematic form, as shown in FIG. 4A, where $G_1\{g_{1i}\}$ and $G_2\{g_{2i}\}$ are the generators of the rate-half encoder. In the recursive systematic encoder of FIG. 4B, the input is divided by $G_1$ and multiplied by $G_2$.

It will be appreciated that both systematic and non-systematic encoders generally have the same trellis structure. However, the outputs produced by these encoders are different, even though the input provided to both encoders is the same. For instance, if the sequence ( . . . 0 0 1 0 0 . . . ) is provided to the non-systematic encoder of FIG. 4A, then the outputs $X_k$ and $X_{1k}$ have a finite number of bits with the value "1" (this number is determined by the constrain length of the code). On the other hand, if the same sequence is provided to the systematic encoder, then a large number (generally limited by N) of bits with the value "1" will be provided at the output $Y_{1k}$. As is known the nonsystematic 40 and the systematic 42 encoders are a finite impulse response (FIR) and an infinite impulse response (IIR) systems, respectively. This property of the recursive systematic code makes it an important ingredient in the design of parallel concatenated codes, where the performance strongly depends on the spectrum of Hamming distances of codewords with small Hamming weight in the information block. It will be appreciated that the Hamming weight of a codeword refers to the number of "1"s in the codeword, where the Hamming distance between two codewords refers to the number of changed symbols (from "0" to "1" or from "1" to "0") in two codewords.

A parallel concatenated code can be treated as a block code, even when encoders 33 and 34 of FIG. 3 are convolutional encoders. For instance, if the encoder 42 shown in FIG. 4B is substituted for the encoders 33, 34 of FIG. 3, then a (3N,N) block code with rate ⅓ is obtained. A zero state is assumed at the beginning and at the end of the block. Since the constituent codes are recursive, it is not sufficient to terminate the block by setting the last M bits of a sequence to zero. However, relatively simple methods for trellis termination are well known, as for example in "Turbo Codes for PCS Applications", by D. Divsalar and F. Pollara, *Proc of the ICC '95*, Seattle, Wash., June 1995, and need not be discussed herein.

From Shannon theory, it is observed that increasing the length of the codeword (or the constraint length in case of a convolutional code) leads to better performance. That is, by adding further redundancy, a lower bit error rate (BER) is achieved. However, the complexity of maximum-likelihood (ML) decoding algorithm increases with the length of the codeword. Since codewords of parallel concatenated codes are relatively long, parallel concatenated codes have the potential of being good codes. The performance of a code is determined primarily by the spectrum of Hamming distances, which will be discussed in more detail below. Also, the interleaver (see FIG. 3) plays an important role in determining the performance of a parallel concatenated code. A ML decoding of a parallel concatenated code is impractical, because of the computational complexity involved. By taking the advantage of the structure of a parallel concatenated code, however, the decoding can be broken into simpler decoding steps, such that the total decoding complexity may be made lower than that of a ML algorithm.

Figure 5:
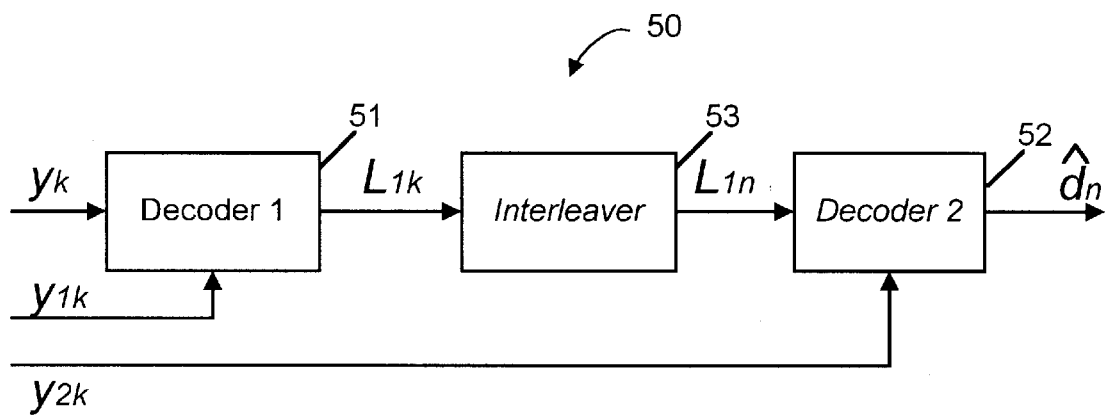
FIG. 5 is a block diagram of a two-stage decoder for decoding a parallel concatenated coded signal, as is generated by the encoder of FIG. 3.

Referring now to FIG. 5, a suboptimal decoder 50 for the parallel concatenated code encoded according to FIG. 3 is presented. This decoder consists of decoders 51, 52 for $c_1$ and $c_2$, and an interleaver 53 which is designed to correspond to the interleaver 38 used in the encoder 30. The inputs to decoder 51 are the received information bits, $y_k$, and the received parity check bits, $y_{ik}$, created by encoder 33. Decoder 51 is a soft in soft out decoder, aimed at providing soft (i.e., weighted) information to decoder 52. It is well known that soft decoding, performed by decoder 52, yields performance that is better than that of hard decoding. For example, if Pr[$d_k$=i|observation], i=0, 1, be the a posteriori probability of the data bit $d_k$, the logarithm of the likelihood ratio (LLR) is the desired output of decoder 51, and is given by:

$$L_{1k} = \log\frac{Pr[d_k = 1|\text{observation}]}{Pr[d_k = 0|\text{observation}]}.$$ Equation (1)

The maximum a posteriori (MAP) algorithm is the optimal soft in soft out decoder. A modification of Bahl's algorithm is known for the recursive systematic codes. The computational complexity of the MAP algorithm is higher (especially when a long interleaver is used) than that of the Viterbi algorithm, which is unable to provide the desired soft output. Modification to the Viterbi algorithm, called soft output Viterbi algorithm (SOVA), has been suggested in literature, and is known by persons skilled in the art. This algorithm produces information regarding the reliability of the received data. From Equation (1) above, it is easy to see that when the difference between $Pr[d_k=1|\text{observation}]$ and $Pr[d_k=0|\text{observation}]$ is small, the LLR of $L_{1k}$, is close to zero. Such a small difference indicates small reliability of the information related to the k-th bit. If $Pr[d_k=1|\text{observation}]>Pr[d_k=0|\text{observation}]$, then $L_{1k}$ has a positive value, which increases with the reliability of the measurement. Namely, the desired soft output can be approximated by multiplying the hard decision with an estimation for the reliability of the measurement. In the SOVA the reliability is evaluated by measuring the difference between a survivor path and the path that has the closest accumulated metric. As this difference increases the reliability of the measurement increases, since the difference between the accumulated metrics of the survivor path and that of the remaining paths increases.

Figure 6:
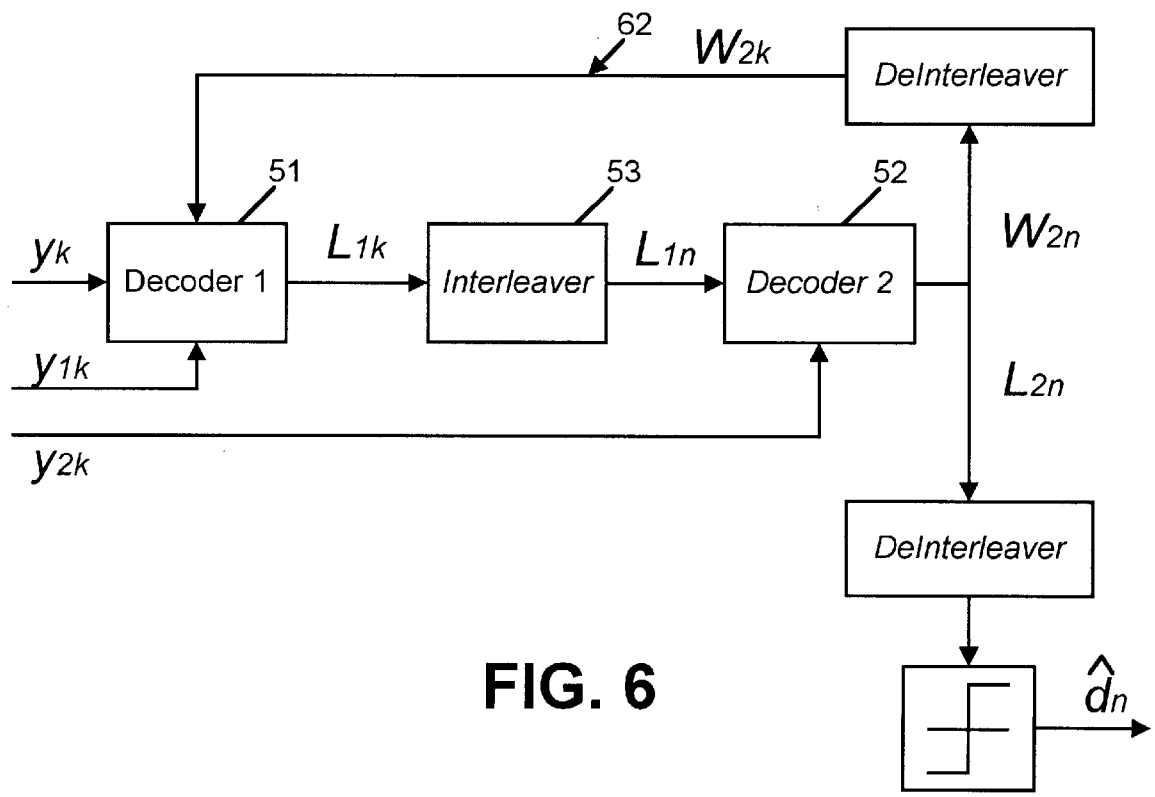
FIG. 6 is a block diagram of a two-state decoder similar to that of FIG. 5, but further employing a feedback loop for improved performance.

As illustrated, decoder 51 in FIG. 5 is not using the data related to the parity check bits of $c_2$. This information is instead utilized by decoder 52, which performs a soft decision. The foregoing decoding algorithm is not optimal, since decoder 51 is not using all the available information (e.g., not using $y_{2k}$). Accordingly, the performance can be improved by substituting decoder 52 for a soft output decoder, similar to decoder 51. The soft output corresponding to the k-th information bit can be expressed in a sum of the input $Y_k$ and an extrinsic information, denoted by $W_k$ (See FIG. 6). The extrinsic information is a function of the redundant information introduced by the encoder. Namely, $W_k$ represents the improvement (due to the parity check bits) obtained in the soft output. By using a feedback loop 62, the extrinsic information produced by decoder 52 is available to decoder 51 (see FIG. 6). The additional information provided by the feedback loop 62 improves the performance of decoder 51, and consequently the performance of decoder 52 (i.e., the decoder's output). Using computational methods that are known, it can be deduced that the iterative decoder presented in FIG. 6 achieves performance that is close to the Shannon limit (and consequently are close to the performance of ML decoding) after a few iterations.

The Impact of the Interleaver on the Performance

Interleaving algorithms and techniques were introduced to the art of communication in order to increase the noise immunity of systems that are subject to burst errors. Interleaving algorithms define the relations among data sequences of different codeword blocks on the transmission channel, and interleaving techniques define the implementation methods to achieve these relations. Examples of interleaving algorithms are block interleaving, and convolutional interleaving. Examples of interleaving techniques are data interleaving and code interleaving.

In data interleaving, information is first applied to an encoder, and the encoder's output is interleaved. In code interleaving (a rarely used technique), the information is interleaved first and then applied to the encoding process. An Interlaced Interleaving technique is also known in a block interleaved arrangement, where the incoming information is gated to multiple encoders. The Interlaced Interleaving approach is an example of code interleaving wherein the information is interleaved first and then encoded. In effect, this method de-interleaves the information, routes the de-interleaved information to encoders, then re-interleaves the information and the redundant symbols. An understanding of interleaving algorithms can be gained by looking at the movement of data symbols in the time domain, or by viewing the process of storing data in a matrix in accordance with one procedure and retrieving it in accordance with another procedure.

In block interleaving, a block of data is rearranged to insure that consecutive symbols in the block prior to interleaving are not adjacent in the block after the interleaving. For example, data is written into the block by row, but read from the block by column. A clear characteristic of block interleaving is that the interleaved data can be separated into blocks of consecutive symbols which correspond to blocks of consecutive symbols in the uninterleaved data. The difference between the two corresponding blocks is in the sequence of symbols in the blocks.

For purposes of explanation, assume each block includes D groups (codewords) of N symbols each. Since block interleaving rearranges the sequence of symbols, it is understood that a delay must be introduced in order to allow later arriving symbols to appear earlier in the interleaved output. To a first degree of approximation, in block encoding, the interleaved data of each block can be obtained only after the entire block of data has arrived. The interleaving of data is accomplished by taking consecutive symbols of each codeword, and dispersing them at intervals of D symbols (the value of D being the interleaving depth). Thus, the first symbol of the first codeword in becomes the first symbol out, but the second symbol of the first codeword in becomes the D+1 symbol out, the third symbol of the first codeword in becomes the 2D+1 symbol out, etc.

As indicated above, the interleaving described above is block interleaving, where one can identify a block of input data and a corresponding block of output data. The output block contains only the data of the input block.

In convolutional interleaving, no output block of contiguous data signals can be found that corresponds to an input block of data, in the sense of containing only the data of the input block. Instead, in convolutional interleaving, where the codeword length N is 11 symbols and the interleaving depth D is 5, it may be said that input block supplies data to an interleaved output symbol sequence of length N×D, but it supplies only some of the symbols, and it also supplies data to a following symbol sequence.

While interleaving methods and techniques are known in the art, a further understanding of interleaving may be obtained from U.S. patent application Ser. No. 08/469,558, filed Jun. 6, 1995, and assigned to the assignee of the present invention, which application is hereby incorporated by reference.

To illustrate mathematically, let $A_{w,j}^{C_1}$ be the number of codewords (in $C_1$) generated by an input information word of Hamming weight w, where the parity check bits have the Hamming weight j. The overall Hamming weight of such a codeword is m=w+j. The input redundancy weight enumerating function (IRWEF) is given by:

$$A_w^{CI} = \sum_j A_{w,j}^{CI} Z^j. \qquad \text{Equation (2)}$$

A random interleaver (sometimes called uniform interleaver) maps a given input word of weight w into all distinct $$\binom{N}{w}$$

permutations of it with an equal probability. When a random interleaver is used, the IRWEF of the parallel concatenated code (PCC) is given by:

$$A_w^{Cp} = \frac{A_w^{C1} A_w^{C2}}{\binom{N}{w}}. \qquad \text{Equation (3)}$$

Let the coefficient $D_m$, corresponding to the codewords with an overall weight of m, be defined as follows:

$$D_m = \sum_{j+w=m} \frac{w}{N} A_{w,j} \qquad \text{Equation (4)}$$

By using the union bound, the bit error rate (BER) of ML decoding can be upper bounded by:

$$P_b \leq \sum_m D_m Q\left(\frac{\sqrt{m}\,\Delta}{2\sigma}\right), \qquad \text{Equation (5)}$$

where $\Delta$ is the Euclidean distance between the signal points in the signal constellation, $\sigma^2$ is the variance of the AWGN, and $$Q(x) = \frac{1}{\sqrt{2\pi}} \int_x^\infty e^{-\frac{y^2}{2}} dy.$$

The union Bound is tight for moderate and large SNR, normally when the BER is smaller than $10^{-4}$. For low SNR the tangential upper bound or the tangential sphere bound can be used. Note that the set of coefficients $\{D_m\}$ plays an important role also in these bounds.

Using known computational methods, it can be deduced that the BER reduces as the value of the elements in the set $\{D_m\}$ decreases. Thus, it is observed that each coefficient $D_m$ decreases when the length of the interleaver increases. Therefore, improved performance can be achieved by employing a random interleaver with a long delay. In comparison with the constituent codes, the parallel concatenated codes, having a random interleaver, provide only small improvement in the asymptotic coding gain. This observation is based on the fact that only a small increase in the minimum distance of the constituent codes is obtained by this parallel concatenated encoding. Most of the known parallel concatenated codes use long random interleavers, designed to achieve large coding gain at BER in the vicinity of $10^{-5}$. Thus, it is seen that the random interleaver is not the optimal interleaver for the case where the length of the interleaver is restricted and the desired BER is very small (e.g., $10^{-7}$ or $10^{-8}$).

In accordance with the concepts and teachings of the present invention, a structured interleaver is substituted in place of the random interleaver. Particularly when a short interleaver is used, it has been realized by the present invention that the desired BER is small, as compared to the use of a short, random interleaver. It is observed that error correction codes have two important parameters that determine the performance of the code. These parameters are the minimum Hamming distance (the minimum value of m), and the set of coefficients $\{D_m\}$ (especially the coefficient corresponding to the minimum distance, called error coefficient). For moderate as well as high SNRs the minimum distance is the dominant parameter, whereas the effect of the error coefficients is treated as a less important factor in the conventional coding theory. For instance, a known rule of thumb is that the coding gain for BER in the vicinity of $10^{-6}$ decreases by 0.2 dB when the error coefficient is multiplied by a factor of two. In fact, that this rule holds for many coding structures. However, in the known parallel concatenated codes excellent performance is achieved due to the tremendous reduction in the error coefficients, obtained by utilizing a very long random interleaver.

As an illustrative example, consider the use of a parallel concatenated code that consists of two identical convolutional codes with M=2. If the generators $G_1=5$ and $G_2=7$ (in octal base) are used, then codewords (of the constituent code) with the minimum distance have the input sequence ( ... 0 0 1 0 1 0 0 ... ). For these codewords w=2, m=5, and $A_{2,3}^{C1}$=N−2. It is readily deduced that the minimum distance of the parallel concatenated code is 8 (the input weight is two and the redundant bits of each constituent code contributes a weight of three). It is further deduced that $$D_8 = \frac{4(N-2)^2}{(N-1)N^2}.$$

Since N>>2, $D_8 \approx 4/N$ (e.g., for N=10,000, $D_8 \approx 0.0004$), which is a very small error coefficient. If the generators $G_1=7$ and $G_2=5$ are used, then a codeword (of the constituent code) with the minimum distance has the input sequence ( ... 0 0 1 1 1 0 0 ... ). For this case w=3, m=5, and $A_{3,2}^{C1}$=N−2. It can thus be deduced that the minimum distance of the parallel concatenated code is 7 (the input weight is three and the redundant bits of each constituent code contributes a weight of two), and that $$D_7 = \frac{18(N-2)}{(N-1)N^2}.$$

Since N>>2, $$D_7 \approx \frac{18}{N^2},$$

e.g., for N=10,000, $D_7 \approx 1.8 \times 10^{-7}$, which is much smaller than the error coefficient obtained for the case where $G_1=5$ and $G_2=7$. It is therefore appreciated that the error coefficient decreases as the weight w (of the codewords with the minimum distance) increases.

As explained above, the advantage of the random interleaver is in reducing the a priori probability of the transmitted sequences, and consequently reducing the error coefficients $\{D_m\}$. Recall that when $G_1=5$ and $G_2=7$, the input sequence ( ... , 0 0 1 0 1 0 0, ... ) yields a sequence of redundant bits with Hamming weight of three by the encoder $e_1$ (See FIG. 3). Using a structured interleaver, however, avoids applying this same input sequence simultaneously to both encoders 33 and 34, and a reduction in the minimum Hamming weight of the parallel concatenated code is achieved.

Figure 7:
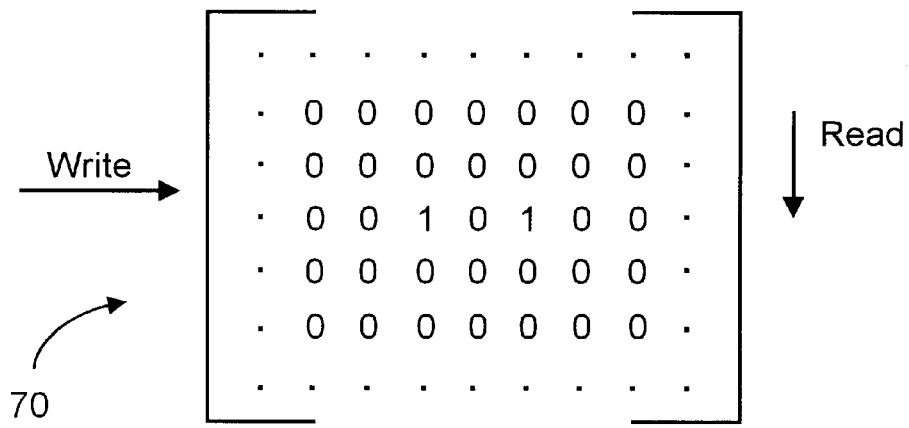
FIG. 7 is a diagram of a matrix illustrating a block interleaver.

Referring now to FIG. 7, a diagram of a simple block interleaver 70 is shown, where the data is written in N, rows of a matrix with $N_2$ columns ($N=N_1N_2$), and read column by column. In FIG. 7 it is also shown that when the "worst" input sequence is provided to encoder 33, the input sequence to encoder 34 contains $3N_2-2$ zeroes between two ones. Namely, the recursive encoder 34, will create in this case a sequence with a relatively large Hamming weight, and consequently a parallel concatenated codeword with large weight obtained for an input sequence with a weight of two.

Figure 8:
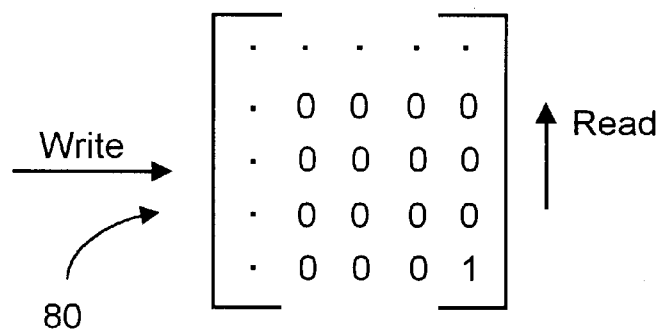
FIG. 8 is a diagram of a matrix illustrating a reverse block interleaver.

It is observed that a block interleaver may suffer from low minimum Hamming distance, due to input sequences with ones at the end of the block. For instance, if a single "1" is located at the end of the input sequence, then a short no sequence is obtained at the end of the redundant sequences created by encoders 33 and 34. One solution to this is simply to utilize a reverse block interleaver 80, as shown in FIG. 8. In this reverse block interleaver 80, the data is read from the end of the last column through a path which is opposite to the path used for the regular block interleaver. If a single one is located at the end of the input sequence (FIG. 8), then a short non-zero sequence will be created by encoder 33, whereas the input of encoder 34 is a single "1" followed by N-1 "0"s, and consequently a long non-zero sequence will be created by encoder 34. Therefore, when a reverse block interleaver is employed, a large Hamming distance is obtained for the foregoing input sequence.

Figure 9:
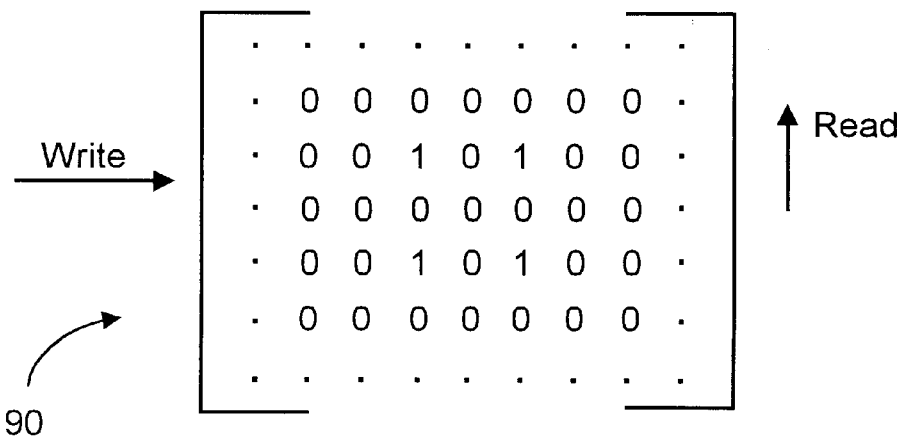
FIGS. 9–12 are diagrams illustrating information sequences for reverse block interleavers.

FIG. 9 is a diagram illustrating the "worst" reverse block interleaver 90, when $G_1=5$ and $G_2=7$. This information matrix includes two columns with "1"s, creating two self-terminated sequences at the output of encoder 34. In this situation, the overall Hamming weight of the parallel concatenated codeword is 16, and is calculated as follows: The Hamming weight of the information sequence is 4. The Hamming weight of the redundant bits created by the input ( . . . 0 0 1 0 1 0 0 . . . ) is 3. Since two sequences of this kind are provided to the encoders 33 and 34, the total Hamming weight of the redundancy is 3×4=12.

Figure 10:
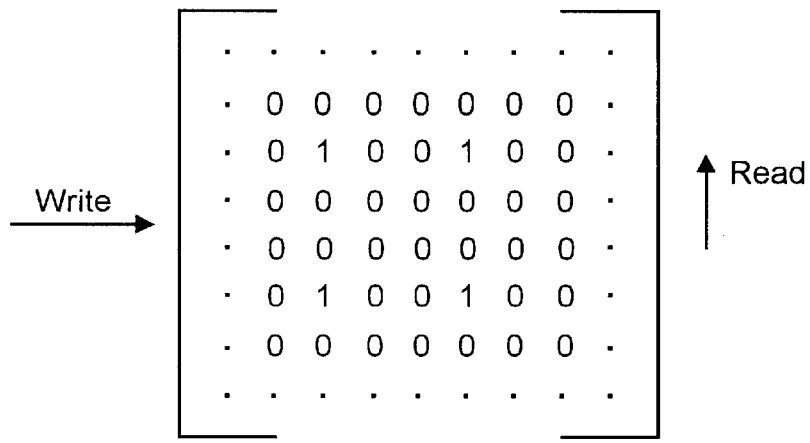

When the reverse block interleaver is utilized, the minimum Hamming distance can be increased by using the generators $G_1=7$ and $G_2=5$. In this case, the constituent encoder produces a redundant sequence of weight two in response to the input ( . . . 0 0 1 1 1 0 0 . . . ), whereas the input ( . . . 0 0 1 0 0 1 0 0 . . . ) yields a redundant sequence of Hamming weight four. Although the latter sequence is not corresponding with the minimum Hamming weight of the constituent code, the parallel concatenated codeword with the minimum weight includes this input sequence. The "worst" input sequence is shown in FIG. 10. In this sequence, the minimum Hamming weight of the parallel concatenated code is 4×4+4=20 (where the first term represents the contribution of the redundant sequence). It is easy to see that the corresponding error coefficient is given by $$D_{20} = \frac{4}{N}(N_1 - 3)(N_2 - 3) < 4. \qquad \text{Equation (6)}$$

Figure 11:
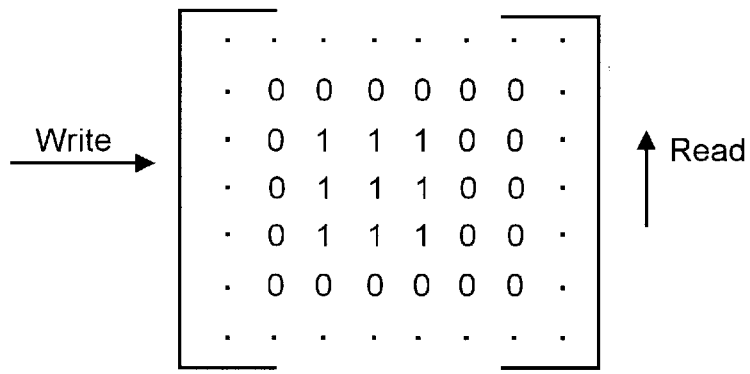

When $G_1=7$ and $G_2=5$, a codeword with a weight of 21 is obtained for the information sequence shown in FIG. 11. Similarly, when $G_1=7$ and $G_2=5$, a codeword with a weight of 22 is obtained for the information sequence shown in FIG. 12. The coefficient $D_{21}$ is given by:

$$D_{21} = \frac{9}{N}(N_1 - 2)(N_2 - 2) < 9. \qquad \text{Equation (7)}$$

Figure 12:
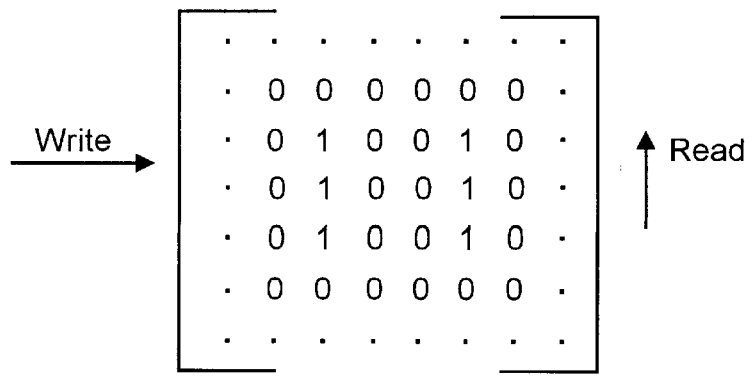

Since a codeword with a Hamming weight of 22 is also obtained by transposing the information matrix of FIG. 12, $D_{22}$ is given by:

$$D_{22} = \frac{6}{N}[(N_1 - 2)(N_2 - 3) + (N_1 - 3)(N_2 - 2)] < 12. \qquad \text{Equation (8)}$$

Figure 13:
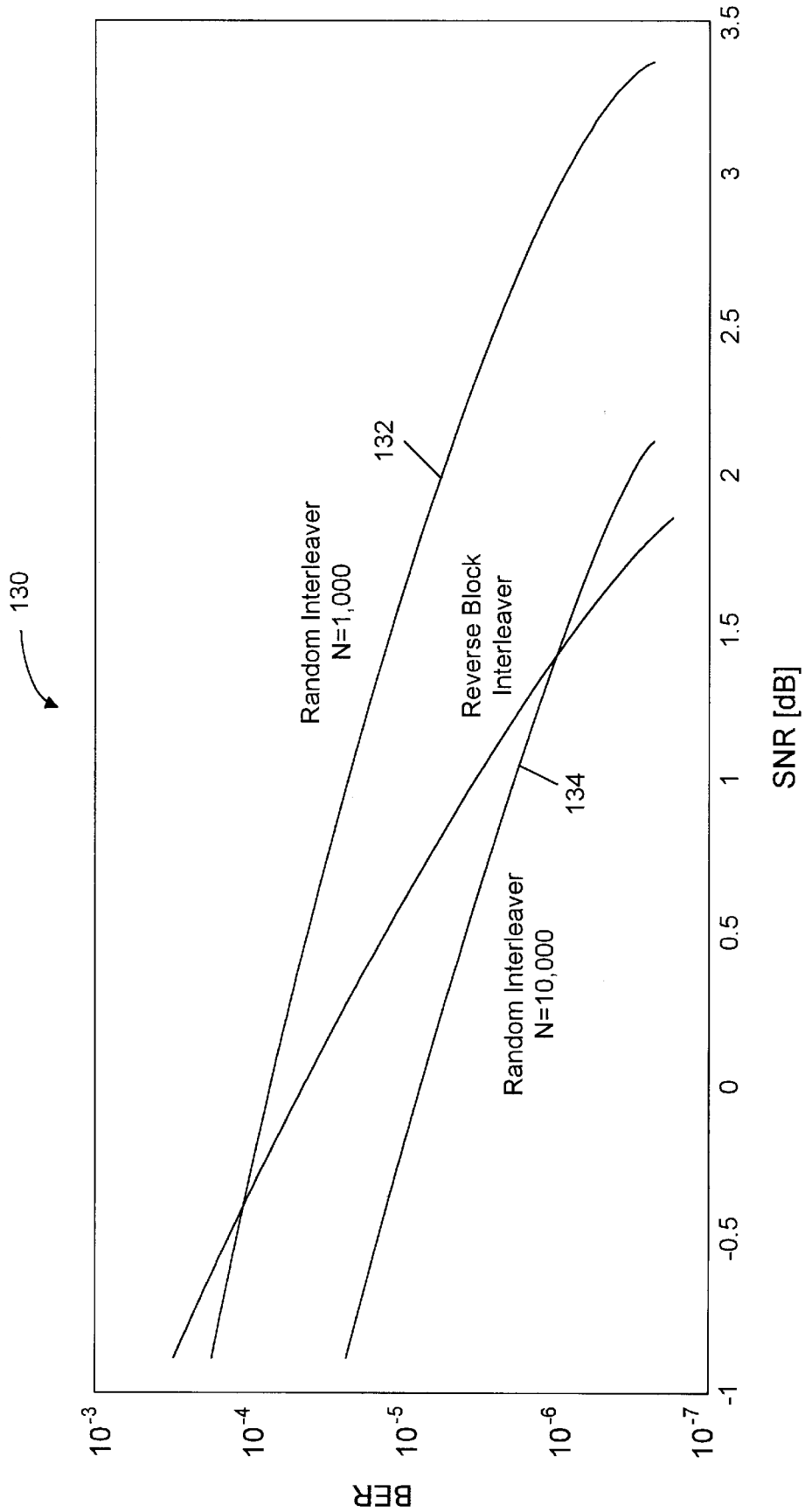
FIGS. 13–17 are computer generated plots illustrating various simulation results comparing bit error rates as a function of the signal to noise ratio.

It will be appreciated that the block interleaver does not have to be long in order to obtain the error coefficients calculate above. In fact, it can be shown that N may be less than 200. For the case where a random interleaver is used, the set $\{D_m\}$ can be calculated according to Equations (3) and (4). For $G_1=5$ and $G_2=7$, with N=1,000, and N=10,000, the resulting error coefficients have been computed and listed in prior art publications, such as "Unveiling Turbo Codes: Some Results on Parallel Concatenated Coding Schemes"," S. Benedetto and G. Montroai, *IEEE Trans. Information Theory*, vol. IT42, pp. 409–428, March 1996. Using the union bound of Equation (5), the BER can be evaluated for low as well as for moderate BER. FIG. 13 is a graph 130 showing the resulting (computed) BER versus SNR for the reverse block interleaver, and random interleaver with lengths of 1,000 132 and 10,000 134. As shown, the random interleaver of length 10,000 134 achieves a lower BER, for a given SNR, than the random interleaver of length 1,000 (as would be expected). At extremely low SNR values, both random interleavers achieve lower BER than that achieved by the reverse block interleaver. However, at SNR values above approximately 1.5, the structured reverse block interleaver achieves a lower BER than both random interleavers 132 and 134. It is appreciated that the length of the reverse block interleaver is shorter then the two random interleavers.

Thus, from FIG. 13 it is deduced that, for low SNRs, there is an advantage to the random interleaver over the reverse block interleaver. However, the parallel concatenated code with the structured interleaver performs better as the desired BER decreases. For BER smaller than $10^{-4}$, the coding gain achieved by the reverse block interleaver is larger than that obtain by the random interleaver with N=1,000. Advantageously, the reverse block interleaver performs batter than a random interleaver with a length of 10,000 when the BER is smaller than $10^{-7}$. The advantage of the reverse block interleaver over the random interleaver increases as the desired BER decreases. As previously discussed, the minimum Hamming distance of the parallel concatenated code with a random interleaver, $G_1=5$, and $G_2=7$ is 8, whereas the minimum distance of the parallel concatenated code with reverse block interleaver $G_1=7$, and $G_2=5$ is 20. Therefore, the asymptotic coding gain, obtained for the reverse block interleaver, is larger than that of the random interleaver by 10 $\log_{10}(20/8)$ =3.98 dB. Clearly, the asymptotic coding gain does not depend on the length of the random interleaver. This phenomenon explains the results in FIG. 13, where the advantage of the longer random interleaver over the shorter random interleaver reduces as the desired BER decreases.

Figure 14:
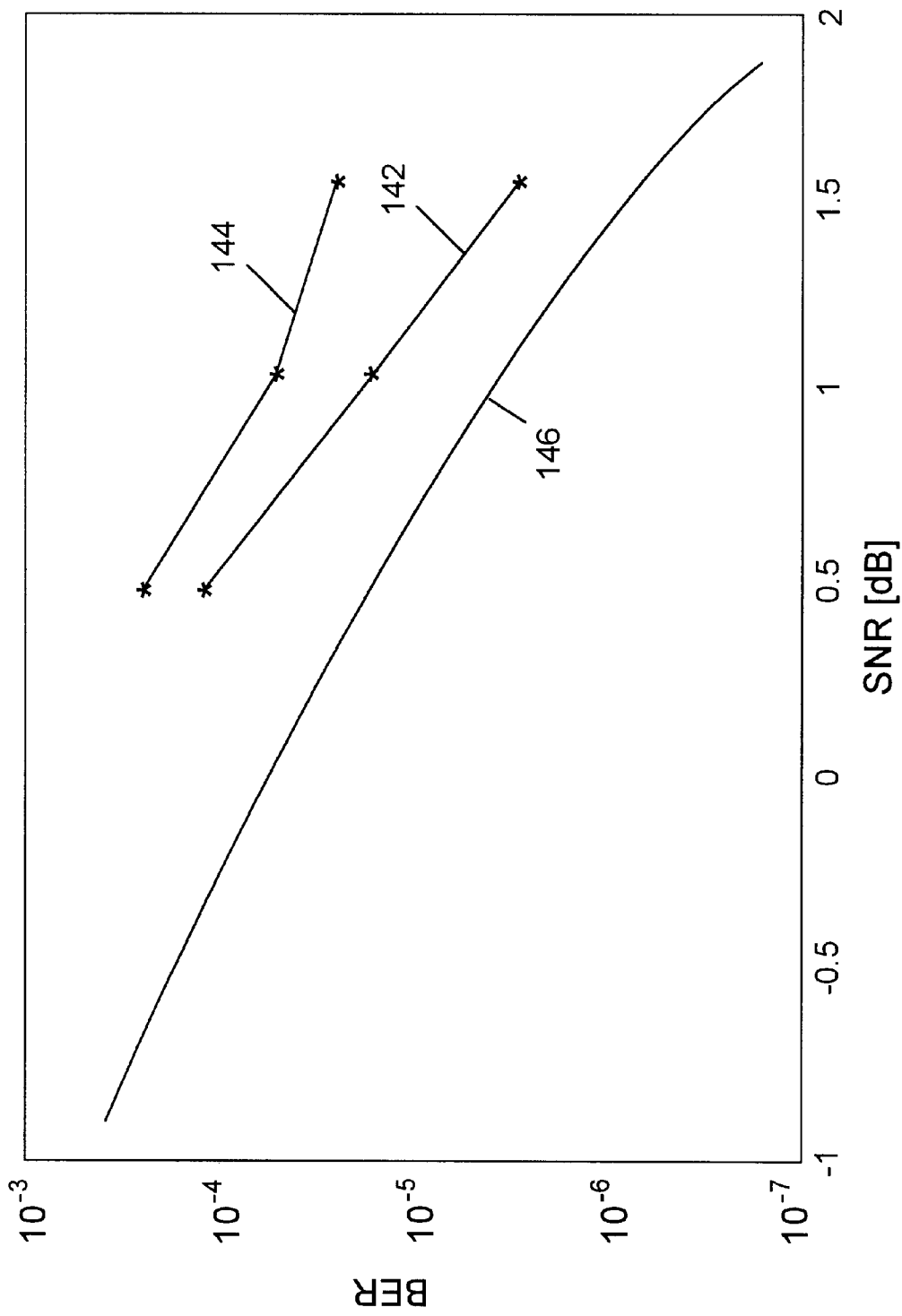

FIG. 14 shows simulation results of parallel concatenated codes with block 144 and reverse block 142 interleavers. Both simulations are based on two 4-state constituent codes decoded by a suboptimal iterative decoder (using the approximation $\log(e^{L1}+e^{L2}) \cong \max(L_1, L_2)$, with 8 iterations.

The performance of the ML decoder for the case of reverse block interleaver is also illustrated as 146. Thus, from FIG. 14 it is observed that the performance of the iterative decoder is close to that of the ML decoder, especially for small BERs. Thus, the advantage of the reverse block interleaver over the block interleaver is clear -from the simulation shown in FIG. 14.

As previously mentioned, a significant advantage achieved through the use of a structured interleaver is the ability to submit less than all information bits to each of the encoders. While it is generally desirable to encode all information bits, such encoding need not be performed at a single encoder. It will be appreciated that the same does not hold true when a random interleaver is used. Indeed, whenever a random interleaver is used, if fewer that all the information bits are submitted to each of the encoders, there is a statistical probability that one or more of the information bits will not be encoded. In contrast, by using a structured in accordance with the present invention, the interleaver can be designed to ensure that all information bits get encoded, even though only a portion of the information bits may be submitted to each encoder.

Multilevel Codes with Parallel Concatenated Codes as Component Codes

Figure 2:
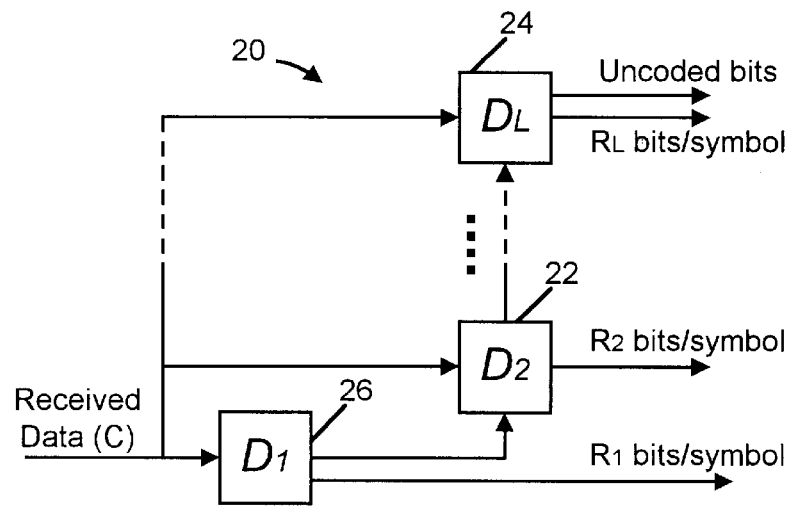
FIG. 2 is a block diagram illustrating a multistage decoder, as is known in the prior art.

Turning now to the evaluation of multilevel codes (See FIG. 1 illustrating a simple multilevel encoder), having parallel concatenated codes as component codes, let $\Delta_i$ be the minimum Euclidean distance between elements in the set $S_i$, where $d^{(i)}$ is the minimum Hamming distance of the binary code $C_i$. It is seen that the minimum squared Euclidean distance between codewords in a multilevel structure is given by:

$$\delta^2 = min(\Delta_0^2 d^{(1)}, \Delta_1^2 d^{(2)}, \ldots, \Delta_{L-1}^2 d^{(L)}). \quad \text{Equation (9)}$$

Furthermore, any product $$\Delta_{i-1}\sqrt{d_j^{(i)}}$$

(where $d_j^{(i)}$ is a possible Hamming distance in the component code of the multilevel code $C_i$) is a possible Euclidean distance between codewords in the multilevel code. Since $S_{i-1}$ is a subset of $Si, \Delta_{i-1} \leq \Delta_i$. Therefore, In order to obtain multilevel code with large coding gain, the correction capability of $C_{i-1}$, should be larger than that of $C_i$. Conventionally, L=2 is used, where in many well known multilevel structure $C_2$ is simply a parity check code, such as the Leech half lattice and lattices from the Barnes-Wall family.

Methods are known for evaluating the BER contributed by each component code. A design rule for multilevel coding is to approach a balance among the BER contributed by the component codes. Notice that this design rule ignores the affect of the errors that might propagate from the bits associated to lower partition levels to the higher levels (due to multistage decoding). However, for moderate as well as low BER, this affect is small. In order to compensate for the error propagation, the BER contributed by the bits related to the lower partition levels should be slightly smaller than that contributed by the higher partition levels.

For simplicity consider an equally spaced q-ary pulse amplitude modulation (q-PAM). Note that the results are applicable, to $q^2$ quadrature amplitude modulation ($q^2$-QAM), and can be extended to other signal constellations. Let $$\delta_j^{(i)} = \Delta_{i-1}\sqrt{d_j^{(i)}},$$

where the set $\{\delta_j^{(i)}\}$ is the set of dominant Euclidean distances, associated with the i-th partition level. Let $S_k^{(i)}$, k=1, 2, ..., $qx2^{-i}$ be a symbol in the subset $S_i$ with the a priori probability $P_k^{(i)}$ (given that the symbol belongs to the subset $S_i$). Let $\alpha_k^{(i)}$ (be the number of neighbors of that symbol in the subset $S_{i-1}$. Notice that for the case of equally spaced q-PAM, $\alpha_k^{(i)}$ may have one of the values 1 or 2. It is then appreciated that the BER contributed by the i-th partition level is upper bounded by the following union bound:

$$P_{bi} \leq B_k^{(i)} Q\left(\frac{\delta_k^{(i)}}{2\sigma}\right), \quad \text{Equation (10)}$$

where $$B_k^{(i)} = D_k^{(i)}\left[\sum_{k=1}^{q2^{-i}} P_k^{(i)}\alpha_k^{(i)}\right]^{d_k^{(i)}}, \quad \text{Equation (11)}$$

and $\{D_k^{(i)}\}$ is the set of coefficients of $C_i$, defined in Equation (4). In case where all the signal points have the same a priori probability, $$B_k^{(i)} = D_k^{(i)}\left[\sum_{k=1}^{q2^{-i}} \frac{2^i}{q}\alpha_k^{(i)}\right]^{d_k^{(i)}}. \quad \text{Equation (12)}$$

From Equation (12) it can be deduced that for 8-PAM and 64-QAM $$B_k^{(1)} = D_k^{(1)}1.75^{d_k^{(1)}}, \text{ and } B_k^{(2)} = D_k^{(2)}1.5^{d_k^{(2)}}, \quad \text{Equation (13)}$$

Figure 15:
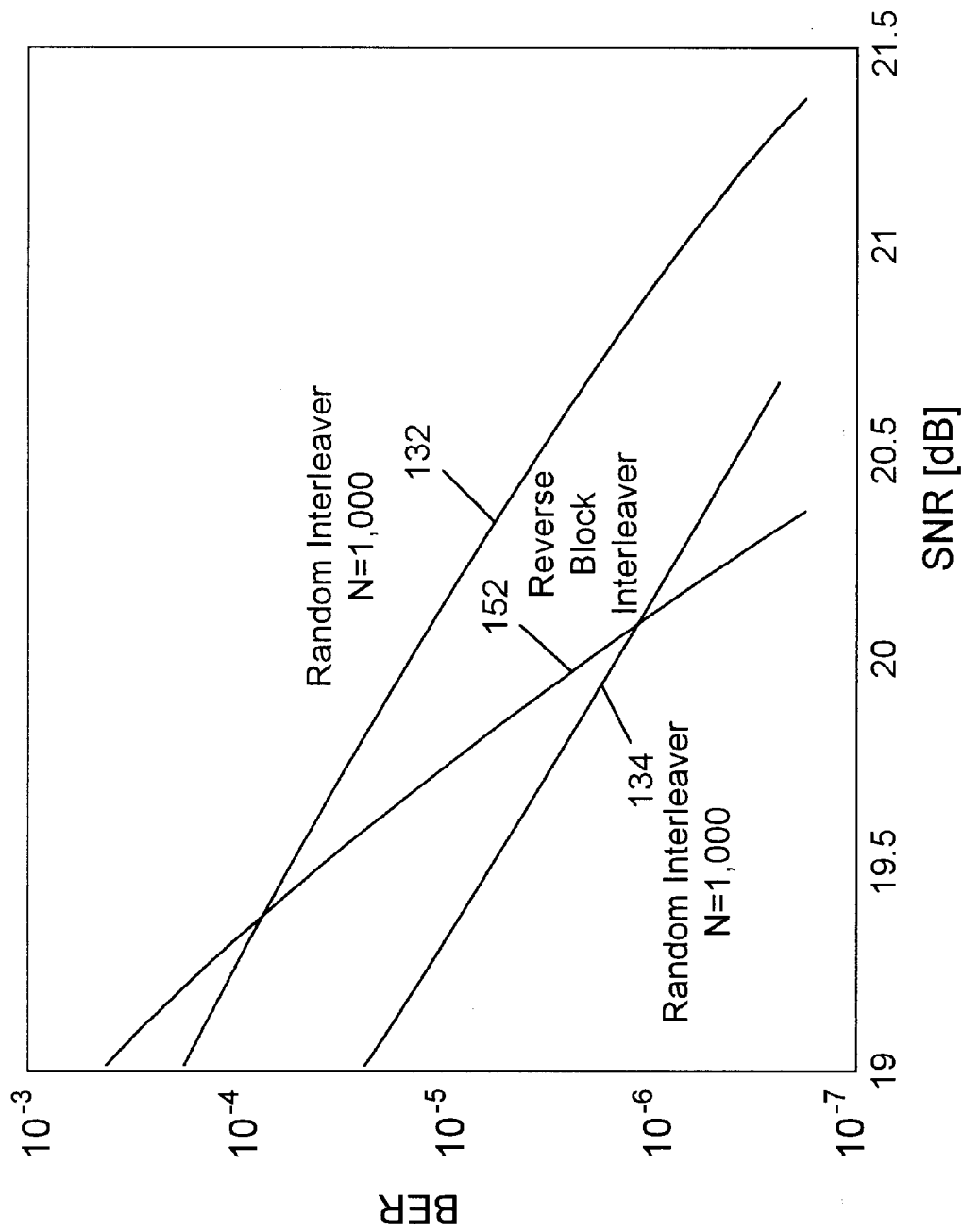

It is seen that the bits associated with the first partition level require the larger correction capability. Therefore, we consider here multilevel codes with parallel concatenated code as $C_1$. As an example assume a signal constellation of 64-QAM. FIG. 15 shows the results of a simulation (computed) illustrating the upper bound on $P_{b1}$, where $C_1$ is a PCCC with M=2. The reverse block interleaver 152 and random interleaver discussed previously, with N=1,000 132, and N=10,000 134 are compared in FIG. 15. The set $B_k^{(1)}$ is calculated according to Equation (13), where the set of the error coefficients $\{D_k^{(1)}\}$ of the random interleaver is given in "Unveiling Turbo Codes: Some Results on Parallel Concatenated Coding Schemes"," S. Benedetto and G. Montroai, *IEEE Trans. Information Theory*, vol. IT-42, pp. 409–428, March 1996, and is calculated in Equations (6)–(8) for the reverse block interleaver. From FIG. 15 it is concluded that for BER smaller than $10^{-7}$, the reverse block interleaver is better than the random interleaver, even when the length of the random interleaver is 10,000. Recall that a similar result is demonstrated in the case of binary modulation with these parallel concatenated code (see FIG. 13).

Figure 16:
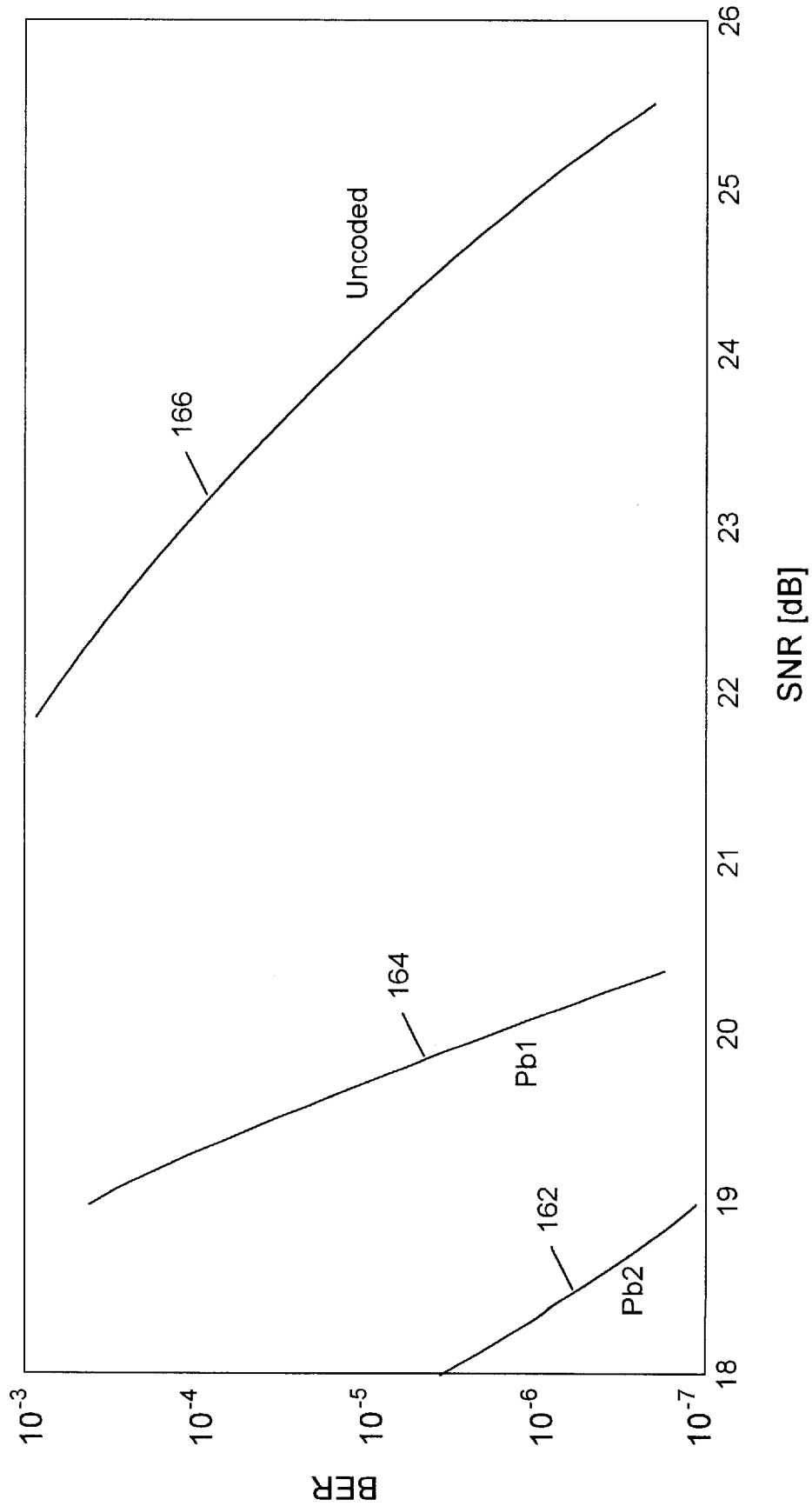

Clearly, the code $C_2$ should preferably have correction capability which is smaller than that of $C_1$. However, a simple parity check code is generally not sufficient, because of the large correction capability obtained when $C_1$ is a parallel concatenated code. On the other hand, in a multilevel structure with L=2, the uncoded bits will contribute an Euclidean distance of $\Delta_2 = 16\Delta_0$. Namely, a minimum Hamming distance of 4 will be sufficient for $C_2$. In order to reduce the decoding complexity, a parallel concatenated block code (PCBC), which employs a parallel concatenation of three parity check codes and two structured interleavers, is used. These interleavers are designed to ensure that two codewords of different constituent codes have only one information bit in common. It can be shown that the dominant Hamming distances $d_k^{(2)}$ are (4, 6, 8), and the corresponding error coefficients $d_k^{(2)}$ are (1, 72, 3096). The BER of $P_{b2}$ is calculated according to Equation (10) and Equation (13), and shown as line 162 in FIG. 16. The BER contributed by the first partition level (where $C_1$ is a PCCC with M=2 and reverse block interleaver), and the BER for the uncoded transmission are also presented in FIG. 16 as lines 164 and 166, respectively. From FIG. 16 it is seen that for BER smaller than $10^{-7}$ a coding gain of about 5 dB may be achieved for this relatively simple structure. It will be appreciated that the real coding gain will depend in part on the performance of the suboptimal iterative decoder.

Figure 17:
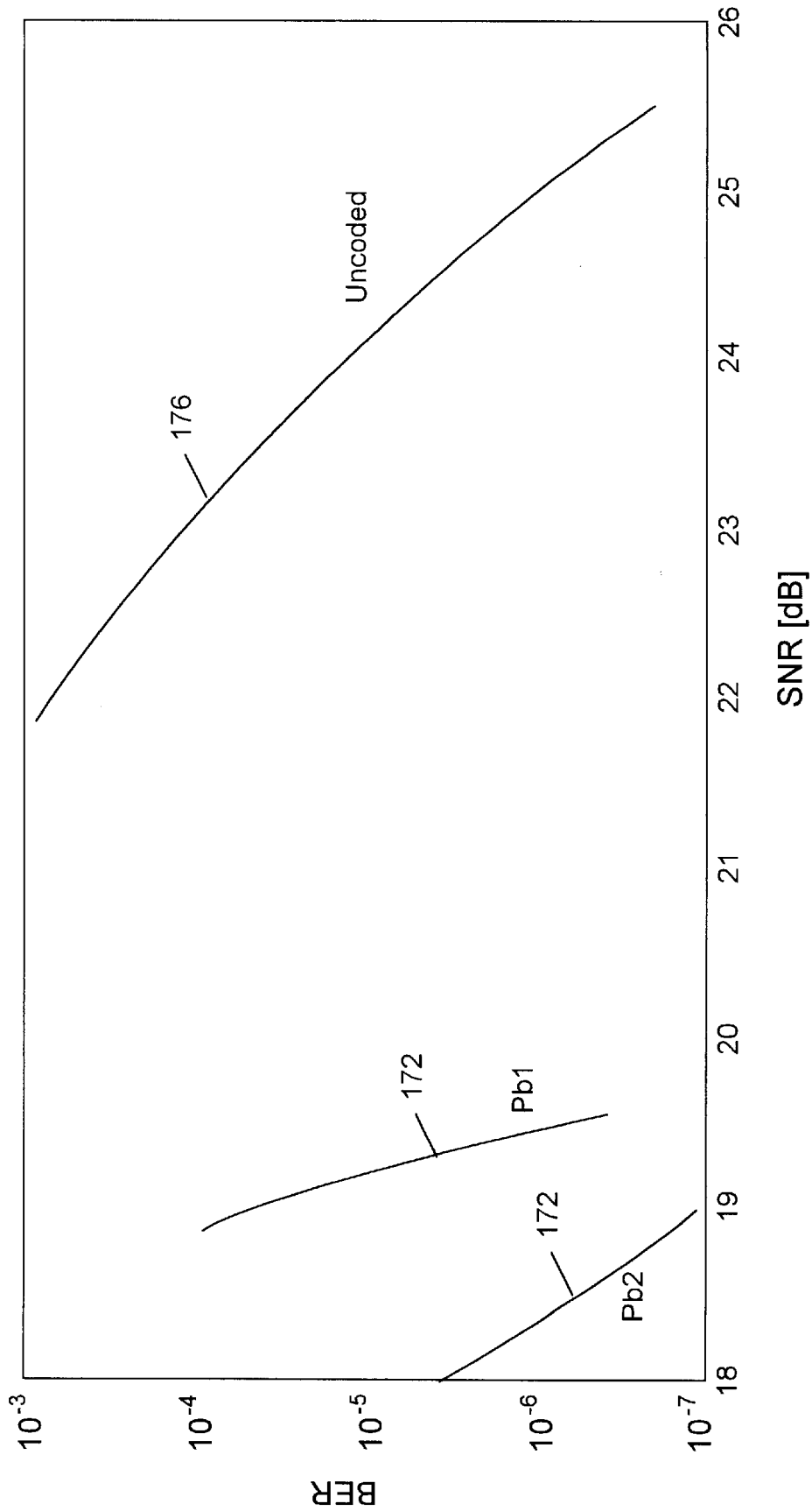

The performance of a multilevel structure can be improved by increasing the correction capability of $C_1$. From the foregoing discussion, it will be appreciated that the convolutional code with $G_1=13$ and $G_2=17$ has the best spectrum of Hamming distances. FIG. 17 shows the resulting $P_{b1}$ (as line 172) when $C_1$, is the foregoing PCCC. For comparison $P_{b2}$ and the BER for the uncoded system are also shown in FIG. 17 (as lines 174 and 176, respectively). In this case a coding gain of more than 5.5 dB may achieved for BERs smaller than $10^{-7}$.

Figure 18A:
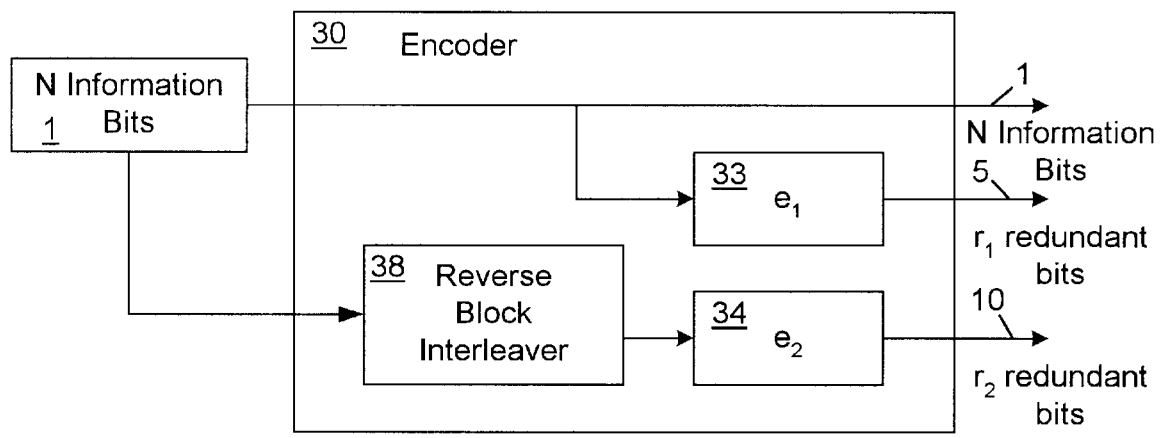
FIGS. 18A and 18B are block diagrams illustrating a method of encoding and a multilevel encoder according to the invention.

FIG. 18A is a block diagram illustrating a method of encoding turbo code utilizing a reverse block structured interleaver. An encoder 30 is shown to illustrate a method of encoding a turbo code utilizing a reverse block interleaver 38. The method processes N information bits 1 through an encoder 33 to create $r_1$ redundant bits 5. The method further processes N information bits 1 through a reverse block interleaver 38 whereby the output is further processed through encoder 34 to create $r_2$ redundant bits 10. Lastly, the method concatenates N information bits 1, $r_1$ redundant bits, and $r_2$ redundant bits to create the encoded output signal.

Figure 18B:
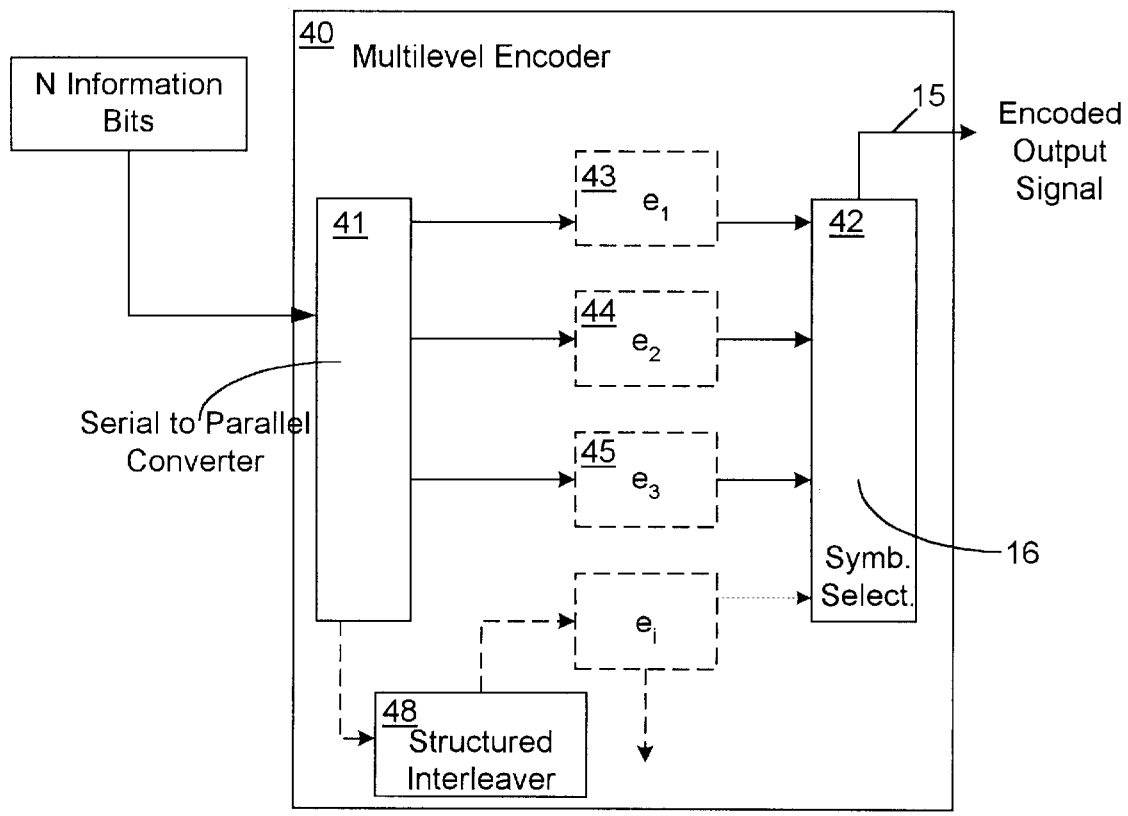

FIG. 18B illustrates a multilevel encoder 40 that uses serial to parallel converter 41 to distribute N information bits 1 to a multiplicity of encoders 43, 44, 45, . . . Serial to parallel converter 41 supplies at least one structured interleaver 48, whose output is further processed by encoder 46. Multilevel encoder 40, then assembles the outputs of encoders 43–46 in symbol selector 16 creating encoded output signal 15. It will be appreciated by those skilled in the art that more than one structured interleaver could be inserted between serial to parallel converter 41 and the multiplicity of encoders 43–46.

The foregoing description has been presented for purposes of illustration and description. It is not intended to be exhaustive or to limit the invention to the precise forms disclosed. Obvious modifications or variations are possible in light of the above teachings. The embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A method for coding an information signal comprising the steps of:

encoding a portion of the information signal with a first encoder to generate a first set of $r_1$ redundant bits, where $r_1$ is an integer value of one or more;

passing a portion of the information signal through a structured interleaver, wherein the structured interleaver is a reverse block interleaver, to generate an interleaved signal;

encoding a portion of the interleaved signal with a second encoder to generate a second set of $r_2$ redundant bits, where $r_2$ is an integer value of one or more; and concatenating the information signal, the first set of redundant bits, and the second set of redundant bits to form an encoded output signal.

2. The method as defined in claim 1, wherein the structured interleaver is a reverse block interleaver defined to write to and read from a matrix of information bits according to the following form:

$$\text{Write} \rightarrow \begin{bmatrix} \cdots & \cdots & \cdots & \cdots \\ \cdots & x & x & x \\ \cdots & x & x & x \\ \cdots & x & x & x \end{bmatrix} \uparrow \text{Read},$$

where the matrix may be of variable dimension and the 'x's denote don't care values.

3. The method as defined in claim 1, wherein $r_1$ equals $r_2$.

4. The method as defined in claim 1, wherein $r_1$ is less than the number of symbols in the information signal.

5. The method as defined in claim 1, wherein $r_2$ is less than the number of symbols in the information signal.

6. The method as defined in claim 1, wherein the information signal is less than 300 symbols.

7. The method as defined in claim 1, further including the steps of:

passing the interleaved signal through a second structured interleaver to generate a second interleaved signal; and encoding the second interleaved signal with a third encoder to generate a third set of $r_3$ redundant bits, where $r_3$ is an integer value of one or more.

8. The method as defined in claim 7, wherein the step of concatenating further includes concatenating the information signal, the first set of redundant bits, the second set of redundant bits, and the third set of redundant bits to form an encoded output signal.

9. An encoded signal embodied in a carrier wave comprising:

a first code segment comprising code for encoding a portion of an information signal with a first encoder to generate a first set of redundant bits;

a second code segment comprising code for passing a portion of the information signal through a structured interleaver, wherein the structured interleaver is a reverse block interleaver, to generate an interleaved signal;

a third code segment comprising code for encoding a portion of the interleaved signal with a second encoder to generate a second set of redundant bits; and a fourth code segment comprising code for concatenating the information signal, the first set of redundant bits, and the second set of redundant bits to form the encoded output signal.

10. A computer readable storage medium containing program code for controlling a method for coding an information signal, the method comprising the steps of:

encoding a portion of the information signal with a first encoder to generate a first set of $r_1$ redundant bits, where $r_1$ is an integer value of one or more;

passing a portion of the information signal through a structured interleaver, wherein the structured interleaver is a reverse block interleaver, to generate an interleaved signal;

encoding a portion of the interleaved signal with a second encoder to generate a second set of $r_2$ redundant bits, where $r_2$ is an integer value of one or more; and concatenating the information signal, the first set of redundant bits, and the second set of redundant bits to form an encoded output signal.

11. An encoder for providing a multilevel encoded signal comprising:

a serial to parallel converter having an input for receiving an input signal and a plurality of outputs;

a plurality of encoders, wherein each of the plurality of encoders has an input and an output, the input of each of the plurality of encoders being associated with one of the outputs of the serial to parallel converter, a symbol selector having a plurality of inputs and an output, each of the plurality of inputs being associated with one of the outputs of the plurality of encoders; and at least one structured interleaver interposed between an output of the serial to parallel converter and the input of the associated encoder.

12. The encoder as defined in claim 11, further including an output of the serial to parallel converter being directly associated with an input of the symbol selector.

13. An encoder for coding an information signal comprising:

a first encoder configured to generate a first set of redundant bits;

a structured interleaver, wherein the structured interleaver is a reverse block interleaver, configured to generate an interleaved signal;

a second encoder configured to generate a second set of redundant bits; and means for concatenating the information signal, the first set of redundant bits, and the second set of redundant bits to form an encoded output signal.

14. The encoder as defined in claim 13, wherein the structured interleaver is a reverse block interleaver defined to write to and read from a matrix of information bits according to the following form:

$$\text{Write} \rightarrow \begin{bmatrix} \ldots & \ldots & \ldots & \ldots \\ \ldots & x & x & x \\ \ldots & x & x & x \\ \ldots & x & x & x \end{bmatrix} \uparrow \text{Read},$$

where the matrix may be of variable dimension and the 'x's denote don't care values.

15. The encoder as defined in claim 13, wherein the first set of redundant bits is smaller than the second set of redundant bits.

16. The encoder as defined in claim 13, wherein the second set of redundant bits is smaller than the first set of redundant bits.

17. The method as defined in claim 13, wherein the information signal is less 300 symbols.

* * * * *

UNITED STATES PATENT AND TRADEMARK OFFICE
CERTIFICATE OF CORRECTION

PATENT NO.     : 5,996,104
DATED          : November 30, 1999
INVENTOR(S)    : Hanan Herzberg It is certified that error appears in the above-identified patent and that said Letters Patent is hereby corrected as shown below:

The title of the invention should be changed from System for Coding System and the correct title of the invention should be System for Coding Signals.

Signed and Sealed this

First Day of May, 2001

Attest:

NICHOLAS P. GODICI

Attesting Officer   Acting Director of the United States Patent and Trademark Office